US011884815B2

(12) United States Patent
Gondaira et al.

(10) Patent No.: US 11,884,815 B2
(45) Date of Patent: Jan. 30, 2024

(54) THERMOSETTING RESIN COMPOSITION, COVERLAY FILM, ADHESIVE SHEET, AND FLEXIBLE PRINTED WIRING BOARD

(71) Applicant: Arisawa MFG. Co., Ltd., Niigata (JP)

(72) Inventors: Takashi Gondaira, Niigata (JP); Katsuhiko Furukawa, Niigata (JP); Shota Abe, Niigata (JP); Takuma Sugai, Niigata (JP)

(73) Assignee: ARISAWA MFG. CO., LTD., Niigata (JP)

( * ) Notice: Subject to any disclaimer, the term of this patent is extended or adjusted under 35 U.S.C. 154(b) by 0 days.

(21) Appl. No.: 17/786,830

(22) PCT Filed: Jul. 5, 2021

(86) PCT No.: PCT/JP2021/025253
§ 371 (c)(1),
(2) Date: Jun. 17, 2022

(87) PCT Pub. No.: WO2022/019095
PCT Pub. Date: Jan. 27, 2022

(65) Prior Publication Data
US 2023/0134682 A1  May 4, 2023

(30) Foreign Application Priority Data

Jul. 22, 2020 (JP) ................................ 2020-124865

(51) Int. Cl.
| | | |
|---|---|---|
| *C08L 63/04* | (2006.01) | |
| *C08F 136/06* | (2006.01) | |
| *C08G 18/10* | (2006.01) | |
| *C08G 18/44* | (2006.01) | |
| *C08G 59/24* | (2006.01) | |
| *C08K 3/22* | (2006.01) | |
| *C08K 5/42* | (2006.01) | |
| *C09J 163/04* | (2006.01) | |

(52) U.S. Cl.
CPC ............ *C08L 63/04* (2013.01); *C08F 136/06* (2013.01); *C08G 18/10* (2013.01); *C08G 18/44* (2013.01); *C08G 59/245* (2013.01); *C08K 3/22* (2013.01); *C08K 5/42* (2013.01); *C09J 163/04* (2013.01); *C08G 2170/00* (2013.01); *C08K 2003/2227* (2013.01); *C08L 2203/20* (2013.01); *C08L 2205/025* (2013.01); *C08L 2205/03* (2013.01); *C08L 2205/22* (2013.01); *C08L 2207/53* (2013.01); *C09J 2203/326* (2013.01); *C09J 2463/00* (2013.01)

(58) Field of Classification Search
None
See application file for complete search history.

(56) References Cited

U.S. PATENT DOCUMENTS

| | | | | |
|---|---|---|---|---|
| 4,778,851 A | * | 10/1988 | Henton | .................. C08L 51/04 525/902 |
| 2013/0031048 A1 | | 1/2013 | Asai et al. | |
| 2013/0255879 A1 | * | 10/2013 | Bieber | ................. C08G 59/186 523/400 |

FOREIGN PATENT DOCUMENTS

| | | |
|---|---|---|
| JP | 2005187810 A | 7/2005 |
| JP | 2007204715 A | 8/2007 |
| JP | 2009096940 A | 5/2009 |
| JP | 2010143981 * | 7/2010 |
| JP | 2013176965 A | 9/2013 |
| TW | 201522497 A | 6/2015 |
| TW | 201703207 A | 1/2017 |

OTHER PUBLICATIONS

Machine translation of Matsuzawa et al. JP2010143981 (Year: 2010).*
International Search Report dated Sep. 14, 2021 in corresponding International PCT Patent Application PCT/JP2021/025253, 6 pgs.
Written Opinion dated Sep. 14, 2021 in corresponding International PCT Patent Application PCT/JP2021/025253, 6 pgs.

* cited by examiner

*Primary Examiner* — Robert T Butcher
(74) *Attorney, Agent, or Firm* — Ohlandt, Greeley and Perle, LLP

(57) ABSTRACT

A thermosetting resin composition contains a solid epoxy resin that is solid at 25° C. a non-solid epoxy resin that is non-solid at 25° C., particulate rubber dispersed in the non-solid epoxy resin, a curing agent, an inorganic filler, and polycarbonate diol-derived polyurethane. The content of the particulate rubber is from 3 to 15 parts by mass with respect to the total parts by mass of the solid epoxy resin and the non-solid epoxy resin, the acid value of the polycarbonate diol-derived polyurethane is from 10 to 30 mgKOH/g, and the weight average molecular weight of the polycarbonate diol-derived polyurethane is from 15,000 to 50,000.

8 Claims, 1 Drawing Sheet

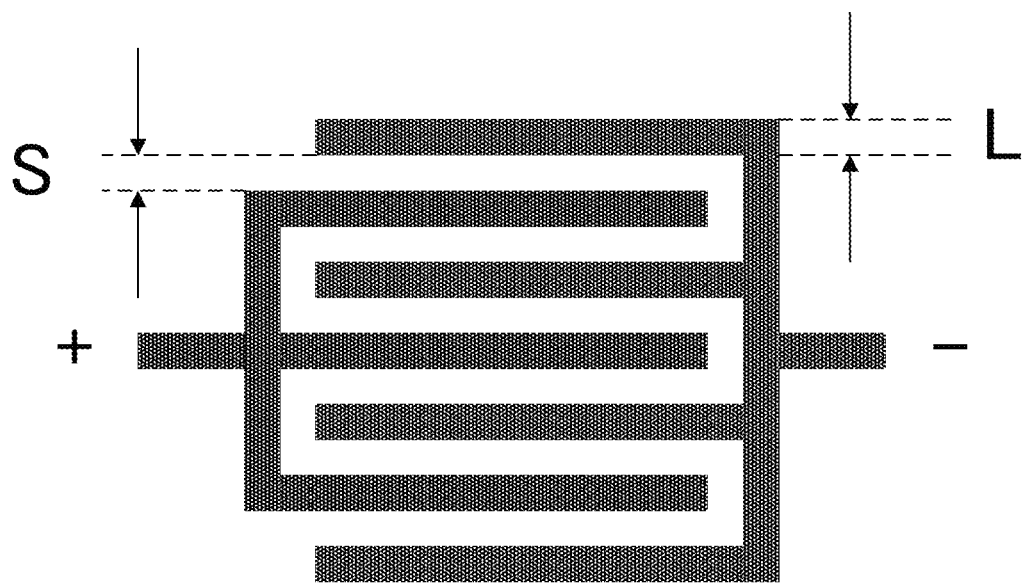

THERMOSETTING RESIN COMPOSITION, COVERLAY FILM, ADHESIVE SHEET, AND FLEXIBLE PRINTED WIRING BOARD

TECHNICAL FIELD

The present disclosure relates to a thermosetting resin composition, a coverlay film, an adhesive sheet, and a flexible printed wiring board.

BACKGROUND ART

Examples of a sheet-type electronic material that constitutes an electronic device include a coverlay film, an adhesive sheet, and a flexible printed wiring board. Such electronic materials are required to have a good balance of physical properties such as peeling strength (hereinafter, also referred to as peel strength), electrical properties such as electrical insulation reliability (hereinafter, also referred to as migration properties), heat resistance properties such as solder heat resistance, and flame retardant properties (see, for example, Patent Literature 1).

CITATION LIST

Patent Literature

Patent Literature 1: Unexamined Japanese Patent Application Publication No. 2005-187810

SUMMARY OF INVENTION

Technical Problem

In recent years, there has been a growing demand for sheet-type electronic materials that can be processed efficiently and easily, and that have excellent electrical insulation reliability under severe conditions. Here, efficient and easy processing means being able to thermo-compress in a short time (hereinafter, also referred to as quick pressing). Having excellent electrical insulation reliability under severe conditions means having excellent electrical insulation reliability in the biased highly accelerated temperature and humidity stress test (BHAST) evaluation, which is an evaluation of electrical insulation reliability under high stress conditions of 110° C., 85% RH, and DC50V, for example.

The present disclosure was made in consideration of the above-described circumstances, and aims to provide a thermosetting resin composition, a coverlay film, an adhesive sheet, and a flexible printed wiring board that can be quick-pressed and has excellent electrical insulation reliability in BHAST.

Solution to Problem

As a result of intensive study to achieve the above-described objectives, the present inventors found that a thermosetting resin composition containing a solid epoxy resin that is solid at 25° C., a non-solid epoxy resin that is non-solid at 25° C., particulate rubber dispersed in the non-solid epoxy resin, a curing agent, an inorganic filler, and polycarbonate diol-derived polyurethane, wherein a content of the particulate rubber is from 3 to 15 parts by mass with respect to a total part by mass of the solid epoxy resin and the non-solid epoxy resin, an acid value of the polycarbonate diol-derived polyurethane is from 10 to 30 mgKOH/g, and the weight average molecular weight of the polycarbonate diol-derived polyurethane is from 15,000 to 50,000 can achieve the above-described objectives.

Specifically, the present disclosure is as follows.

[1] A thermosetting resin composition comprising a solid epoxy resin that is solid at 25° C., a non-solid epoxy resin that is non-solid at 25° C., particulate rubber dispersed in the non-solid epoxy resin, a curing agent, an inorganic filler, and polycarbonate diol-derived polyurethane, wherein a content of the particulate rubber is from 3 to 15 parts by mass with respect to a total part by mass of the solid epoxy resin and the non-solid epoxy resin, an acid value of the polycarbonate diol-derived polyurethane is from 10 to 30 mgKOH/g, and a weight average molecular weight of the polycarbonate diol-derived polyurethane is from 15,000 to 50,000.

[2] The thermosetting resin composition according to the above-described [1], wherein the particulate rubber comprises core-shell polymer particles.

[3] The thermosetting resin composition according to the above-described [1] or [2], wherein when a total part by mass of the solid epoxy resin and the non-solid epoxy resin is 100 parts by mass, parts by mass of the particulate rubber and the non-solid epoxy resin are from 15 to 40 parts by mass.

[4] The thermosetting resin composition according to any of the above-described [1] to [3], wherein when a total part by mass of the solid epoxy resin and the non-solid epoxy resin is 100 parts by mass, parts by mass of the polycarbonate diol-derived polyurethane are from 50 to 100 parts by mass.

[5] The thermosetting resin composition according to any of the above-described [1] to [4], wherein when a total part by mass of the solid epoxy resin and the non-solid epoxy resin is 100 parts by mass, parts by mass of the inorganic filler are from 60 to 150 parts by mass.

[6] A coverlay film comprising a base material and an adhesive layer that is layered on one side of the base material, wherein an adhesive material of the adhesive layer comprises the thermosetting resin composition according to any of the above-described [1] to [5].

[7] An adhesive sheet comprising the thermosetting resin composition according to any one of the above-described [1] to [5].

[8] A flexible printed wiring board comprising a substrate on which wiring is formed and a coverlay film comprising a base material and an adhesive layer that is layered on one side of the base material, wherein the coverlay film is provided in such a manner that the adhesive layer contacts the surface of the substrate on which the wiring is formed, wherein the coverlay film is the coverlay film according to the above-described [6].

Advantageous Effects of Invention

According to the present disclosure, a thermosetting resin composition, a coverlay film, an adhesive sheet, and a flexible printed wiring board that can be quick-pressed and has excellent electrical insulation reliability in BHAST can be provided.

BRIEF DESCRIPTION OF DRAWINGS

FIG. 1 is a plan view illustrating a wiring pattern employed in a characteristic evaluation test of a flexible printed wiring board using the thermosetting resin composition of the present disclosure.

DESCRIPTION OF EMBODIMENTS

Hereinafter, description of embodiments (hereinafter referred to as embodiments) is described in detail. The following embodiments are examples to illustrate the present disclosure, and are not intended to limit the present disclosure to the following contents. The present disclosure can be implemented with appropriate variations within the scope of the gist thereof Thermosetting Resin Composition The thermosetting resin composition of the present disclosure is mainly suitably used as a resin composition for electronic materials such as a coverlay film, an adhesive sheet, and a flexible printed wiring board.

The thermosetting resin composition of an embodiment contains a solid epoxy resin that is solid at 25° C., a non-solid epoxy resin that is non-solid at 25° C., particulate rubber dispersed in the non-solid epoxy resin, a curing agent, an inorganic filler, and polycarbonate diol-derived polyurethane. The content of the particulate rubber is from 3 to 15 parts by mass with respect to the total parts by mass of the solid epoxy resin and the non-solid epoxy resin, the acid value of the polycarbonate diol-derived polyurethane is from 10 to 30 mgKOH/g, and the weight average molecular weight of the polycarbonate diol-derived polyurethane is from 15,000 to 50,000.

Epoxy Resin

From the viewpoint of uniformly mixing a thermosetting resin composition, the viewpoint of spreading a resin to fine grooves between wires (hereinafter, also referred to as wiring embedability), the viewpoint of improving the electrical insulation reliability after curing of the thermosetting resin composition, and the viewpoint of imparting heat resistance, an epoxy resin in the thermosetting resin composition of an embodiment contains both a solid epoxy resin that is solid at 25° C. and a non-solid epoxy resin that is non-solid at 25° C.

From the viewpoint of increasing reactivity and the viewpoint of enhancing electrical insulation reliability after curing of a thermosetting resin composition, a solid epoxy resin that is solid at 25° C. contains two or more epoxy groups in one molecule and has an epoxy equivalent of from 150 to 500 g/eq, and more preferably from 150 to 350 g/eq. Examples of the epoxy resin include a bisphenol A epoxy resin, a bisphenol F epoxy resin, a bisphenol S epoxy resin, a novolac epoxy resin, an amine-type epoxy resin, a biphenyl epoxy resin, and an alicyclic epoxy resin, all of which have an epoxy equivalent in the range of the above-described epoxy equivalent. From the viewpoint of electrical insulation reliability and flame retardance, a bisphenol A epoxy resin is preferable, and a biphenyl epoxy resin is more preferable. Two or more types of epoxy resins may be used. A solid epoxy resin that is solid at 25° C. may be dissolved in an organic solvent beforehand to facilitate mixing with another material contained in a thermosetting resin composition. The epoxy equivalent of the epoxy resin can be measured in accordance with JIS K7236 2001.

The content of the solid epoxy resin that is solid at 25° C. is preferably from 60 to 85 parts by mass when the total of the epoxy resins (the solid epoxy resin that is solid at 25° C. and the non-solid epoxy resin that is non-solid at 25° C.) contained in the thermosetting resin composition is 100 parts by mass. When the content of the solid epoxy resin that is solid at 25° C. is within the range of from 60 to 85 parts by mass, the tackiness (stickiness) can be suppressed when, for example, the thermosetting resin composition is processed into a sheet shape and the cured state of the thermosetting resin composition is set to a semi-cured state (B stage). Furthermore, air (bubbles) mixed in during quick pressing can be reduced. Here, parts by mass used herein means parts by mass in terms of non-volatile content. For example, parts by mass in terms of non-volatile content refer to parts by mass of a resin (non-volatile content) excluding volatile components such as organic solvents contained in the resin. The semi-cured state (B-stage) refers to a state in which the curing reaction of the thermosetting resin composition has progressed halfway but not completely.

A non-solid epoxy resin that is non-solid at 25° C. means an epoxy resin that is fluid at 25° C. From the viewpoint of improving the dispersibility of particulate rubber and the viewpoint of enhancing the peel strength of a sheet-type electronic material comprising a thermosetting resin composition, a non-solid epoxy resin at 25° C. contains two or more epoxy groups in one molecule, and has an epoxy equivalent of from 100 to 400 g/eq, and more preferably from 150 to 350 g/eq. Examples of the epoxy resin include a bisphenol A epoxy resin, a bisphenol F epoxy resin, a phenol novolac epoxy resin, an amine-type epoxy resin, and an alicyclic epoxy resin, all of which have an epoxy equivalent within the above-described range. Two or more types of epoxy resins may be used. From the viewpoint of heat resistance, a bisphenol A epoxy resin is preferable, and a phenol novolac epoxy resin is more preferable. From the viewpoint of achieving physical properties, such as peel strength, of a sheet-type electronic material comprising a thermosetting resin composition, it is preferable to use a particulate rubber uniformly dispersed in a non-solid epoxy resin at 25° C. before preparing the thermosetting resin composition.

The content of a non-solid epoxy resin that is non-solid at 25° C. is preferably from 15 to 40 parts by mass, more preferably from 15 to 35 parts by mass, and still more preferably from 15 to 30 parts by mass, when the total of the epoxy resins (the solid epoxy resin that is solid at 25° C. and a non-solid epoxy resin that is non-solid at 25° C.) contained in a thermosetting resin composition is 100 parts by mass. When the content of the non-solid epoxy resin at 25° C. is within the range of from 15 to 40 parts by mass, the peel strength of a sheet-type electronic material comprising a thermosetting resin composition can be maintained at a high level.

Particulate Rubber

The particulate rubber is preferably a core-shell polymer particle comprising a core layer and a shell layer covering the surface of the core layer.

The polymer comprising the core layer is a polymer having rubber-like elasticity. Examples of a polymer having rubber-like elasticity include a diene rubber, acrylic rubber, styrene rubber, and polysiloxane rubber. The polymer may comprise two or more types of polymers.

Examples of a polymer constituting a shell layer include a (co)polymer obtained by copolymerization of one or more components selected from a (meth)acrylic ester monomer, an aromatic vinyl monomer, a vinyl cyanide monomer, an unsaturated acid derivative, a (meth)acrylamide derivative, and a maleimide derivative. The polymer constituting the shell layer is bonded to a polymer constituting a core layer by graft polymerization. This allows the shell layer to stably cover part or all of the surface of the core layer and prevent reagglomeration of core-shell polymer particles.

From the viewpoint of compatibility with an epoxy resin, it is preferable that a functional group that reacts with a resin or a curing agent contained in a thermosetting resin composition is introduced into the polymer constituting the shell layer. Examples of the functional group include a hydroxyl group, a carboxyl group, and an epoxy group, and from the viewpoint of improving the compatibility with an epoxy resin, an epoxy group is preferred.

From the viewpoint of achieving favorable dispersibility, the size of particulate rubber is preferably from 0.05 to 1 μm in terms of average particle diameter.

The content of the particulate rubber is preferably from 3 to 15 parts by mass, more preferably from 3 to 13 parts by mass, and still more preferably from 3 to 10 parts by mass, when the total of epoxy resins contained in a thermosetting resin composition (a solid epoxy resin at 25° C. and a non-solid epoxy resin at 25° C.) is 100 parts by mass. When the content of the particulate rubber is within the range of from 3 to 15 parts by mass, the peel strength of a sheet-type electronic material comprising a thermosetting resin composition can be maintained at a high level without degrading the electrical insulation reliability after curing of the thermosetting resin composition.

From the viewpoint of uniform dispersion in a thermosetting resin composition, it is preferable to use particulate rubber dispersed in a non-solid epoxy resin that is non-solid at 25° C.

Examples of particulate rubber dispersed in a non-solid epoxy resin at 25° C. include MX-136, MX-153, MX-154, MX-170, MX-217, MX-257, MX-416, MX-451, MX-551, MX-960, and MX-965 manufactured by Kaneka Corporation.

Curing Agent

The curing agent is preferably one that cures an epoxy resin. Examples of the curing agent include diaminodiphenylmethane (DDM), diaminodiphenyl sulfone (DDS), diaminodiphenyl ether (DDE), hexamethylenediamine, dicyandiamide, and phenol novolac. Among these, dicyandiamide is preferable from the viewpoint of ease of control of a curing reaction, and diaminodiphenyl sulfone is more preferable. Two or more types of curing agents may be used.

From the viewpoint of improving the wiring embedability and the electrical insulation reliability after curing of a thermosetting resin composition, the equivalent amount of a curing agent to one equivalent amount of an epoxy group of epoxy resins (a solid epoxy resin that is solid at 25° C. and a non-solid epoxy resin that is non-solid at 25° C.) contained in a thermosetting resin composition is preferably from 0.3 to 0.8 equivalents, and more preferably from 0.3 to 0.6 equivalents.

Inorganic Filler

Examples of an inorganic filler include aluminum hydroxide, magnesium hydroxide, and silica. Among these, from the viewpoint of improving flame retardance and wiring embedability, and from the viewpoint of imparting the tack-free property required in quick pressing, magnesium hydroxide is preferable, and aluminum hydroxide is more preferable. Two or more types of inorganic fillers may be used.

From the viewpoint of achieving favorable flame retardance and wiring embedability, and from the viewpoint of imparting tack-free properties, the content of an inorganic filler is preferably from 60 to 150 parts by mass, more preferably from 60 to 120 parts by mass, and still more preferably from 70 to 100 parts by mass when the total of epoxy resins (a solid epoxy resin that is solid at 25° C. and a non-solid epoxy resin that is non-solid at 25° C.) contained in the thermosetting resin composition is 100 parts by mass.

Polyurethane Derived from Polycarbonate Diol

A polyurethane derived from a polycarbonate diol included in the thermosetting resin composition of Embodiments includes at least one or more poly carbonate skeletons in the molecule. The number of polycarbonate skeletons is not particularly limited as long as the polyurethane is a polyurethane derived from polycarbonate diol. When a polyurethane includes at least one or more polycarbonate skeletons in the molecule, hydrolysis of the polyurethane is inhibited in a high temperature and high humidity environment after curing of a thermosetting resin composition. This can ensure high electrical insulation reliability after curing of a thermosetting resin composition. The thermosetting resin composition of the present disclosure contains polyurethane derived from polycarbonate diol, which imparts membrane properties. This gives a flexibility necessary for a sheet-type electronic material such as a coverlay film or an adhesive sheet.

Examples of a polycarbonate diol include a poly carbonate diol represented by the following general formula (1).

[Chem. 1]

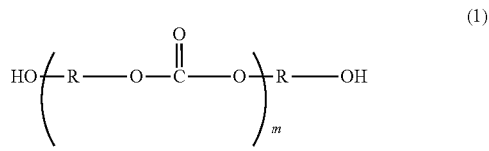

(1)

(R represents an alkylene group having from 1 to 10 carbon atoms, and m is an integer from 1 to 20.)

From the viewpoint of inhibiting hydrolysis of polyurethane in a high temperature and high humidity environment after curing of a thermosetting resin composition, and from the viewpoint of improving the peel strength of a sheet-type electronic material comprising a thermosetting resin composition, it is preferable that the number of carbon atoms of R in the general formula (1) is from 1 to 10 and m is from 1 to 20.

A polyurethane derived from a polycarbonate diol is obtained by polymerizing a polycarbonate diol represented by the general formula (1) with a polyisocyanate. The polyisocyanate is not particularly limited as long as the polyisocyanate is a polyisocyanate that can react with a polycarbonate diol represented by the general formula (1) to form a polyurethane. Examples of a polyisocyanate include an aromatic diisocyanate such as tolylene-2,4-diisocyanate, 4-methoxy-1,3-phenylenediisocyanate, 2,4-diisocyanate diphenyl ether, 4,4'-methylenebis(phenylenediisocyanate) (MDI), 2,4'-methylenebis(phenylenediisocyanate), tolylene diisocyanate (TDI), xylylene diisocyanate (XDI), or 1,5-naphthalene diisocyanate; an aliphatic diisocyanate such as methylene diisocyanate or 1,6-hexane diisocyanate (HDI); and an alicyclic diisocyanate such as 1,4-cyclohexylene diisocyanate, 4,4'-methylenebis(cyclohexyl diisocyanate), or isophorone diisocyanate (IPDI).

The polyisocyanate may be a compound in which these isocyanate compounds are reacted with a low molecular weight polyol or a polyamine to make the terminal functional groups isocyanate groups. The polyisocyanate may be used singly or may be used in combination with two or more types of polyisocyanates. Isophorone diisocyanate is preferred from the viewpoint of heat resistance, flexibility, and reactivity.

A polyurethane derived from a polycarbonate diol is preferably acidic from the viewpoint of improving the peel strength of a sheet-like electronic material comprising a thermosetting resin composition. A polyurethane derived from a polycarbonate diol that is acidic preferably includes a hydroxyl group, a sulfo group, or a carboxyl group in the molecular chain (mainly a side chain) of the polyurethane, and more preferably includes a carboxyl group from the viewpoint of improving the reactivity with an epoxy resin and improving the electrical properties of the thermosetting resin composition after curing. The acidity can be indicated by the acid value.

The acid value of a polyurethane derived from a polycarbonate diol is from 10 to 30 mgKOH/g, and is preferably from 10 to 25 mgKOH/g. When the acid value of a polyurethane derived from a polycarbonate diol is from 10 to 30 mgKOH/g, the wiring embedability is favorable, and the peel strength of a sheet-like electronic material comprising a thermosetting resin composition is improved.

The acid value of a polyurethane derived from a polycarbonate diol can be measured in accordance with HS K0070.

From the viewpoint of increasing the peel strength of a sheet-like electronic material comprising a thermosetting resin composition, the content of a polyurethane derived from a polycarbonate diol is preferably from 50 to 100 parts by mass, more preferably from 60 to 90 parts by mass, and still more preferably from 70 to 80 parts by mass, when the total of epoxy resins (a solid epoxy resin that is solid at 25° C. and a non-solid epoxy resin that is non-solid at 25° C.) contained in the thermosetting resin composition is 100 parts by mass.

The weight average molecular weight of a polyurethane derived from a polycarbonate diol is preferably from 15,000 to 50,000, more preferably from 20,000 to 45,000, and still more preferably from 25,000 to 40,000. When the weight average molecular weight of a polyurethane derived from a polycarbonate diol is 15,000 to 50,000, the flexibility of a thermosetting resin composition after curing is improved, and the wiring embedability is favorable. The weight average molecular weight of a polyurethane derived from a polycarbonate diol can be measured by gel permeation chromatography (GPC) using standard polystyrene with an average molecular weight of from about 500 to about 1,000,000.

Other Components

The thermosetting resin composition of Embodiments may further contain another additive or the like. Examples of the other additive include an imidazole accelerator such as 2-methylimidazole, N-benzyl-2-methylimidazole, or 2-undecylimidazole, a Lewis acid complex such as boron trifluoride monoethylamine, a cure accelerator such as a polyamine or a melamine resin, a dispersing agent, a softening agent, an anti-aging agent, a pigment, a dye, and a silane coupling agent.

Coverlay Film

A coverlay film is used, for example, for protecting a wiring formed on a substrate. A coverlay film comprises a base material and an adhesive layer that is layered on one side of the base material. Adhesive layers may be provided on both sides of a film type base material. By using a coverlay film having this configuration, the wiring surfaces of a plurality of substrates can be protected by a single coverlay film. Furthermore, a substrate can be multilayered.

A base material constituting a coverlay film is a film type base material. The thickness of the base material is from 2 to 75 μm.

Examples of a base material for a coverlay film include a polyimide (PI) base material, a polyamide (PA) base material, a polyethylene naphthalate (PEN) base material, a polyamide-imide (PAI) base material, a polyethylene terephthalate (PET) base material, a polyphenylene sulfide (PPS) base material, and a liquid crystal (LCP) base material. From the viewpoints of flame retardance, electrical insulation reliability, heat resistance, and elastic modulus, a polyimide (PI) base material is preferred. The surface of a base material can be subjected to a surface modification treatment such as a corona treatment or a plasma treatment. This modifies the surface of the base material, and improves the adhesion between an adhesive layer and the base material.

An adhesive layer comprises a thermosetting resin composition of an embodiment. The thickness of an adhesive layer after drying is from 5 to 50 The cured state of a thermosetting resin composition constituting an adhesive layer is a semi-cured state (B-stage).

A coverlay film is prepared by the following procedure. A solution containing a thermosetting resin composition dissolved in an organic solvent is prepared. The solution is then applied onto a film type base material. Next, the thermosetting resin composition is heated until the composition is in a semi-cured state (B-stage). After cooling, a coverlay film in which an adhesive layer comprising the thermosetting resin composition is formed on the film type base material is obtained. The heating conditions are from 100 to 250° C. and from 5 seconds to 30 minutes, and are adjusted depending on the application thickness.

Examples of an organic solvent include an alcohol such as methanol or ethanol; a glycol such as ethylene glycol or propylene glycol; a glycol monoalkyl ether such as ethylene glycol monomethyl ether or ethylene glycol monoethyl ether; a glycol dialkyl ether such as ethylene glycol dimethyl ether or ethylene glycol diethyl ether; an alkyl ester such as methyl acetate, ethyl acetate, propyl acetate, or methyl acetoacetate; a ketone such as acetone, methyl ethyl ketone, methyl isobutyl ketone, or cyclohexanone; an aromatic hydrocarbon such as benzene, toluene, xylene, or ethylbenzene; an aliphatic hydrocarbon such as hexane, cyclohexane, or octane; an amide such as dimethylformamide, dimethylacetamide, or N-methylpyrrolidone; and a cyclic ether such as tetrahydrofuran or dioxane.

The application apparatus is not particularly limited, and any known coater can be used. Examples thereof include a die coater, a comma coater, and a gravure coater.

When the thickness of an adhesive layer constituting a coverlay film is 5 μm or less, the following procedure can be used to prepare the coverlay film. First, an adhesive layer is formed on the surface of a release film that has undergone a mold release treatment in such a manner that the thickness after drying is 5 μm. Then, a film type base material to be used for a coverlay film is separately prepared, and layered in such a manner that the surface of the base material and the surface of the adhesive layer come into contact with each other. Next, the resulting layered body is heated and pressurized, and then only the release film is peeled off. As a result, a coverlay film in which the thickness of the adhesive layer is 5 μm can be obtained.

Adhesive Sheet

An adhesive sheet is obtained by forming an adhesive material comprising a thermosetting resin composition of an embodiment into a sheet shape.

The thickness of an adhesive layer constituting an adhesive sheet is from 5 to 50 μm.

An adhesive sheet is prepared by the following procedure. A solution containing a thermosetting resin composition dissolved in an organic solvent is prepared. The solution is applied onto a release treated surface of a film type base material that has undergone a release treatment. Next, the thermosetting resin composition is heated until the composition is in a semi-cured state (B-stage). After cooling, an adhesive sheet in which an adhesive layer comprising the thermosetting resin composition is formed on the film type base material is obtained. The heating conditions are from 100 to 250° C. and from 5 seconds to 30 minutes, and are adjusted depending on the application thickness. When using the adhesive sheet, the film base material is peeled off from the adhesive layer.

Examples of a mold release treatment agent used for a base material to which a mold release treatment has been applied include a silicone treatment agent and a fluorine treatment agent.

From the viewpoint of increasing rigidity and electrical insulation reliability, another configuration of an adhesive sheet is, for example, one in which an adhesive layer is provided on both sides of a film type base material.

From the viewpoint of increasing rigidity and electrical insulation reliability, yet another configuration of an adhesive sheet is a prepreg in which a thermosetting resin composition is impregnated into a base material such as a woven or nonwoven fabric. A prepreg is prepared by the following procedure. First, a woven or non-woven fabric comprising glass fibers or the like is prepared as the base material. Next, a solution containing a thermosetting resin composition dissolved in an organic solvent is prepared. The base material is impregnated with the solution. The base material pulled up from the solution is heated until the attached thermosetting resin composition is in B stage. After cooling, a prepreg in B stage is obtained.

An adhesive sheet can be utilized as an interlayer adhesive material for bonding substrates such as flexible printed wiring boards together. When an adhesive sheet covers wiring, the wiring can be protected.

Flexible Printed Wiring Board

A flexible printed wiring board includes a substrate on which wiring is formed and a coverlay film comprising a base material and an adhesive layer that is layered on one side of the base material, and the coverlay film is provided in such a manner that the adhesive layer is in contact with the surface on which the wiring of the substrate is formed.

Wiring formed on a substrate is, for example, wiring formed by etching a copper layer of a copper-plated layered plate or a copper-clad layered plate. Another type of wiring formed on a substrate may be wiring formed by inkjet printing utilizing conductive ink. The material of the wiring may comprise another metal, such as silver or zinc, in place of copper.

The thickness of a substrate used for a flexible printed wiring board is not particularly limited, and from the viewpoint that the substrate is flexible, the thickness is from 15 to 200 μm.

A flexible printed wiring board is prepared by the following procedure. A substrate on which wiring is formed and a coverlay film comprising a base material and an adhesive layer that is layered on one side of the base material are prepared. Next, the coverlay film is layered in such a manner that the adhesive layer is in contact with the surface of the substrate on which the wiring is formed, and the film and the substrate are heated and pressurized. As a result, a flexible printed wiring board is obtained. Conditions for heating and pressurization are from 120 to 250° C., from 5 seconds to 120 minutes, and from 1 to 10 MPa, and are set depending on the configuration of layering.

EXAMPLES

The present disclosure is described in more detail by the following Examples. The present invention is not limited in any way by the following Examples.

Components contained in resin compositions used in Examples and Comparative Examples are as follows.

Epoxy Resins (1) Epoxy resin A: Biphenyl epoxy resin, solid at 25° C., with an epoxy equivalent of 290 g/eq (manufactured by Nippon Kayaku Co., Ltd., NC3000H), (2) Epoxy resin B: Bisphenol A epoxy resin, non-solid at 25° C., with an epoxy equivalent of 190 g/eq (manufactured by DIC Corporation, EPICLON 850), (3) Epoxy resin C: Particulate rubber-dispersed epoxy resin (phenol novolac type), non-solid at 25° C., with an epoxy equivalent of 231 g/eq, and containing 25 parts by mass of particulate rubber (polybutadiene rubber, average particle diameter 0.1 μm) out of 100 parts by mass of total solid content (MX-217, manufactured by Kaneka Corporation), and (4) Epoxy resin D: Particulate rubber-dispersed epoxy resin (bisphenol A type), non-solid at 25° C., with an epoxy equivalent of 294 g/eq, and containing 37 parts by mass of particulate rubber (polybutadiene rubber, average particle diameter 0.1 μm) out of 100 parts by mass of total solid content (MX-257, manufactured by Kaneka Corporation).

Curing Agent

Diaminodiphenyl sulfone: Amine value 62 g/eq (manufactured by Konishi Chemical Ind. Co., Ltd., 3, 3'-DAS).

Inorganic Filler

Aluminum hydroxide (manufactured by Nippon Light Metal Company, Ltd., BF013).

Polyurethane Derived from Polycarbonate Diol

[Synthesis of Polyurethane a Derived from Polycarbonate Diol]

To a 1-liter flask equipped with a stirrer, a thermometer, and a cooling tube, 250.0 g of (a) carbonate polyol (manufactured by UBE INDUSTRIES, LTD., ETERNACOLL (registered trademark) UH-100 (hydroxyl value 112 mgKOH/g)), 32.1 g of (b) dimethylolpropanoic acid, and 104.2 g of (c) isophorone diisocyanate were added. Furthermore, dimethylacetamide equivalent to 10% by mass of the total amount of (a), (b), and (c) and toluene equivalent to 45% by mass of the total amount of (a), (b), and (c) were added as solvents, and the mixture was stirred at 100° C. After a reaction was carried out until NCO groups disappeared, methyl ethyl ketone equivalent to 45% by mass of the total amount of (a), (b), and (c) was added to obtain a polyurethane resin solution having a resin content of 45% by mass.

Polyurethanes B to I derived from polycarbonate diols were synthesized in the same method as for the synthesis of polyurethanes A derived from polycarbonate diols, with different amounts of each component added, as shown in Table 1 below.

TABLE 1

| | SYNTHESIS EXAMPLE 1 POLYURE-THANE A | SYNTHESIS EXAMPLE 2 POLYURE-THANE B | SYNTHESIS EXAMPLE 3 POLYURE-THANE C | SYNTHESIS EXAMPLE 4 POLYURE-THANE D | SYNTHESIS EXAMPLE 5 POLYURE-THANE E | SYNTHESIS EXAMPLE 6 POLYURE-THANE F | SYNTHESIS EXAMPLE 7 POLYURE-THANE G | SYNTHESIS EXAMPLE 8 POLYURE-THANE H | SYNTHESIS EXAMPLE 9 POLYURE-THANE I |
|---|---|---|---|---|---|---|---|---|---|
| (a) POLYCARBONATE DIOL | 250.0 | 250.0 | 250.0 | 250.0 | 250.0 | 250.0 | 250.0 | 250.0 | 250.0 |
| (b) DIMETHYLOL PROPANOIC ACID | 32.1 | 26.4 | 16.7 | 7.7 | 4.0 | 16.7 | 16.7 | 16.7 | 16.7 |
| (c) ISOPHORONE DIISOCYANATE | 104.2 | 95.2 | 79.8 | 65.4 | 59.6 | 70.6 | 74.8 | 81.4 | 82.3 |
| NCO/OH | 0.96 | 0.96 | 0.96 | 0.96 | 0.96 | 0.85 | 0.90 | 0.98 | 0.99 |
| NUMBER AVERAGE MOLECULAR WEIGHT | 24,000 | 20,000 | 21,000 | 16,000 | 15,000 | 8,000 | 10,300 | 29,500 | 35,000 |
| WEIGHT AVERAGE MOLECULAR WEIGHT | 46,000 | 37,000 | 38,000 | 29,000 | 24,000 | 14,000 | 15,200 | 49,500 | 63,000 |
| ACID VALUE (mgKOH/G) | 35.1 | 29.5 | 21.0 | 10.2 | 5.5 | 20.9 | 20.4 | 20.5 | 20.4 |

In the table, values shown in (a), (b), and (c) represent mass (g), respectively Other Flexibility Components (1) Polyester polyurethane J: Number average molecular weight 13,000, acid value 35 mgKOH/g (manufactured by TOYOBO CO., LTD., UR-3500)

(2) Acrylonitrile butadiene rubber K: acid value 40 mgKOH/g (manufactured by JSR, JSR XER-32C).

In Examples and Comparative Examples, evaluation and measurement methods were performed by the following methods.

<Peeling Strength (Peel Strength)>

(1) Sample Preparation Procedure (1-1) Preparation of Coverlay Film

A resin composition to be an adhesive layer was applied to one side of a polyimide film (manufactured by Kaneka Corporation, APICAL 12.5NPI) with a thickness of 12.5 μm in such a manner that the thickness after drying was 25 and dried at 160° C. for 10 minutes until the film reached a semi-cured state (B stage). Then, a release PET film was laminated to the adhesive layer side at 100° C. to obtain a coverlay film with a release PET film.

(1-2) Preparation of Samples for Measurement

The release PET film was peeled off from the coverlay film prepared in (1-1), the surface of the adhesive layer and a glossy surface of a rolled copper foil (manufactured by JX Nippon Mining & Metals Corporation, BHY-22B-T, 35 μm thick) were bonded together, and the film and the substrate were heated and pressurized under conditions of 185° C., 3.0 MPa, and 60 sec. Then, the film and the substrate were heated in an oven at 160° C. for 1 hour to obtain a sample for measurement.

(2) Measurement Method

The sample for measurement prepared in (1-2) was cut into 10 mm (width)×100 mm (length), and the peeling strength in the 180° direction (parallel to the surface of the sample for measurement) was measured using an Autograph AGS-500 manufactured by Shimadzu Corporation under the following measurement conditions.

The measurement conditions were copper foil pulling with a test speed of 50 mm/min.

The evaluation criteria were as follows

Excellent: Peeling strength of 10 N/cm or more.

Good: Peeling strength is from 7N/cm to less than 10N/cm.

Poor: Peeling strength is less than 7N/cm.

<Electrical Insulation Reliability (BHAST)>

(1) Sample Preparation Procedure (1-1) Preparation of Coverlay Film

A resin composition to be an adhesive layer was applied to one side of a polyimide film (manufactured by Kaneka Corporation, APICAL 12.5NPI) with a thickness of 12.5 μm in such a manner that the thickness after drying was 15 μm, and dried at 160° C. for 10 minutes until the film reached a semi-cured state (B stage). Then, a release PET film was laminated to the adhesive layer side at 100° C. to obtain a coverlay film with a release PET film.

(1-2) Preparation of Adherend

A glossy copper foil surface of a two-layer substrate (manufactured by Arisawa Mfg. Co., Ltd., PNS H0509RAC) was etched to obtain an adherend on which a wiring pattern (hereinafter, expressed as L/S=20/20) whose width (L) and spacing (S) of the wiring shown in FIG. 1 were 20 μm each was formed.

(1-3) Preparation of Sample for Measurement

The release PET film was peeled off from the coverlay film prepared in (1-1), the coverlay film was layered on the adherend prepared in (1-2) on which wiring was formed in such a manner that the surface of the adhesive layer and the surface of the adherend were facing each other, and the coverlay film and the adherend were heated and pressurized at conditions of 185° C., 3.0 MPa, and 60 seconds. The coverlay film and the adherend were then heated in an oven at 160° C. for 1 hour to obtain a sample for measurement.

(2) Measurement Method

One end and the other end of wiring were connected to one end and the other end of wiring of a device, respectively, in such a manner that a voltage was applied to the wiring pattern. After the connection, the presence or absence of appearance changes such as short-circuit and dent light was visually checked and evaluated after 200 hours under the conditions of 110° C., 85% RH, and DC50V.

The evaluation criteria were as follows.

Excellent: No short circuit or change in appearance after 200 hours.

Good: No short circuit after 200 hours, but appearance changed.

Poor: Short-circuited before reaching 200 hours and appearance changed.

<Wiring Embedability>

(1) Sample Preparation Procedure (1-1) Preparation of Coverlay Film

A resin composition to be an adhesive layer was applied to one side of a polyimide film (manufactured by Kaneka Corporation, APICAL 12.5NPI) with a thickness of 12.5 μm in such a manner that the thickness after drying was 15 μm, and heated at 160° C. for 10 minutes until the film reached a semi-cured state (B stage). Then, a release PET film was laminated to the adhesive layer side at 100° C. to obtain a coverlay film with a release PET film.

(1-2) Preparation of Adherend

As the adherend, the glossy side of the copper foil of a two-layer substrate with a 25 μm thick polyimide layer formed on the rough side of an electrolytic copper foil (manufactured by JX Nippon Mining & Metals Corporation, 18 μm thick) was etched to obtain wiring patterns with L/S=50/50, 60/60, 70/70, 80/80, 90/90, and 100/100, respectively.

(2) Evaluation Method

The release PET film was peeled off from the coverlay film prepared in (1-1), the coverlay film was layered on the adherend prepared in (1-2) on which wiring was formed in such a manner that the surface of the adhesive layer and the surface of the adherend were facing each other, and thermocompression processing (quick pressing) was performed on the coverlay film and the adherend under conditions of 185° C., 3.0 MPa, and 30 seconds, or conditions of 185° C., 3.0 MPa, and 60 seconds. The samples were then heated in an oven at 160° C. for one hour. Then, after cooling the bonded sample, the sample was cut perpendicular to the longitudinal direction of the wiring. After polishing the cut surface, the sample was observed under an optical microscope, and evaluated whether the wiring embedability was favorable or not.

The evaluation criteria were as follows.

Excellent: The molding time of quick pressing was 30 seconds, and the resin was spread over the grooves between wires.

Good: When the molding time of quick pressing was 30 seconds, the resin did not spread over the grooves between wires, but when the molding time was 60 seconds, the resin spread over the grooves.

Poor: In both the case where the molding time of quick pressing was 30 seconds and the case where the molding time of quick pressing was 60 seconds, the resin did not spread over the grooves between the wires.

Example 1

To a container, 70 parts by mass of the epoxy resin A and 30 parts by mass of the epoxy resin C were added to make the total parts by mass of epoxy resin to be 100 parts by mass. To this, 10.4 parts by mass of a curing agent, 75 parts by mass of polycarbonate diol-derived polyurethane B, 90 parts by mass of water oxidation aluminum, and 400 parts by mass of methyl ethyl ketone as an organic solvent were added. These were then stirred at room temperature to obtain a thermosetting resin composition.

Example 2 to Example 12, and Comparative Example 1 to Comparative Example 11

Thermosetting resin compositions were obtained by changing the type and content of each component as shown in Tables 2 and 3, and preparing them in the same manner as in Example 1. The units of content in the Tables are in parts by mass unless otherwise specified.

TABLE 2

| | | EXAMPLE 1 | EXAMPLE 2 | EXAMPLE 3 | EXAMPLE 4 | EXAMPLE 5 | EXAMPLE 6 | EXAMPLE 7 | EXAMPLE 8 | EXAMPLE 9 | EXAMPLE 10 | EXAMPLE 11 | EXAMPLE 12 |
|---|---|---|---|---|---|---|---|---|---|---|---|---|---|
| COMPOSITION | EPOXY RESIN (A) | 70 | 70 | 70 | 70 | 85 | 60 | | 70 | 70 | 70 | | 70 |
| | EPOXY RESIN (B) | | | | | | | | | | | | |
| | EPOXY RESIN (C) | 30 | 30 | 30 | 30 | 15 | 40 | | 30 | 30 | 30 | 30 | 30 |
| | EPOXY RESIN (D) | | | | | | | 40 | | | | | |
| | PARTICULATE RUBBER (NUMBER OF PARTS IN EPOXY RESIN) | 7.5 | 7.5 | 7.5 | 7.5 | 3.8 | 10.0 | 14.8 | 7.5 | 7.5 | 7.5 | 7.5 | 7.5 |
| | CURING AGENT EQUIVALENT NUMBER | 0.45 eq | 0.45 eq | 0.45 eq | 0.45 eq | 0.45 eq | 0.45 eq | 0.45 eq | 0.45 eq | 0.45 eq | 0.45 eq | 0.45 eq | 0.45 eq |
| | PARTS BY MASS(*) | 10.4 | 10.4 | 10.4 | 10.4 | 10.0 | 10.6 | 9.6 | 10.4 | 10.4 | 10.4 | 10.4 | 10.4 |
| | INORGANIC FILLER | 90 | 90 | 90 | 90 | 90 | 90 | 90 | 60 | 150 | 90 | 90 | 90 |
| | POLYCARBONATE DIOL-DERIVED POLYURETHANE A | | | | | | | | | | | | |
| | POLYCARBONATE DIOL-DERIVED POLYURETHANE B | 75 | | | | | | | | | | | |

TABLE 2-continued

| | | EXAMPLE 1 | EXAMPLE 2 | EXAMPLE 3 | EXAMPLE 4 | EXAMPLE 5 | EXAMPLE 6 | EXAMPLE 7 | EXAMPLE 8 | EXAMPLE 9 | EXAMPLE 10 | EXAMPLE 11 | EXAMPLE 12 |
|---|---|---|---|---|---|---|---|---|---|---|---|---|---|
| | POLYCARBONATE DIOL-DERIVED POLYURETHANE C | | 50 | 75 | 100 | 75 | 75 | 75 | 75 | 75 | | | |
| | POLYCARBONATE DIOL-DERIVED POLYURETHANE D | | | | | | | | | | 75 | | |
| | POLYCARBONATE DIOL-DERIVED POLYURETHANE E | | | | | | | | | | | | |
| | POLYCARBONATE DIOL-DERIVED POLYURETHANE F | | | | | | | | | | | | |
| | POLYCARBONATE DIOL-DERIVED POLYURETHANE G | | | | | | | | | | | 75 | |
| | POLYCARBONATE DIOL-DERIVED POLYURETHANE H | | | | | | | | | | | | 75 |
| | POLYCARBONATE DIOL-DERIVED POLYURETHANE I | | | | | | | | | | | | |
| | POLYESTER-BASED POLYURETHANE J | | | | | | | | | | | | |
| | ACRYL NITRILE BUTADIENE RUBBER K | | | | | | | | | | | | |
| EVALUATION | PEEL STRENGTH | Excellent | Good | Excellent | Excellent | Good | Excellent | Excellent | Excellent | Good | Excellent | Good | Excellent |
| | ELECTRICAL INSULATION RELIABILITY (BHAST) | Excellent | Excellent | Excellent | Excellent | Excellent | Good | Good | Excellent | Excellent | Good | Excellent | Excellent |
| | WIRING EMBEDABILITY | Good | Good | Excellent | Good | Excellent | Good | Good | Good | Good | Excellent | Excellent | Good |

(*)The mass of the curing agent was adjusted in such a manner that the equivalent amount of the curing agent to one equivalent epoxy group was 0.45 eq.

TABLE 3

| | | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 | COMPARATIVE EXAMPLE 8 | COMPARATIVE EXAMPLE 9 | COMPARATIVE EXAMPLE 10 | COMPARATIVE EXAMPLE 11 |
|---|---|---|---|---|---|---|---|---|---|---|---|---|
| COMPOSITION | EPOXY RESIN (A) | 70 | 70 | 70 | 70 | 70 | 70 | 90 | | 100 | 70 | 70 |
| | EPOXY RESIN (B) | | | | | | | | | | | 30 |
| | EPOXY RESIN (C) | 30 | 30 | 30 | 30 | 30 | 30 | 10 | 100 | | 30 | |
| | EPOXY RESIN (D) | | | | | | | | | | | |
| | PARTICULATE RUBBER (NUMBER OF PARTS IN EPOXY RESIN) | 7.5 | 7.5 | 7.5 | 7.5 | 7.5 | 7.5 | 2.5 | 25.0 | 0.0 | 7.5 | 0.0 |
| | CURING AGENT EQUIVALENT NUMBER | 0.45 eq | 0.45 eq | 0.45 eq | 0.45 eq | 0.45 eq | 0.45 eq | 0.45 eq | 0.45 eq | 0.45 eq | 0.45 eq | 0.45 eq |
| | PARTS BY MASS(*) | 75 | | | | | | | | | | |
| | INORGANIC FILLER | | | | | | | | | | | |
| | POLYCARBONATE DIOL-DERIVED POLYURETHANE A | | | | | | | | | | | |
| | POLYCARBONATE DIOL-DERIVED POLYURETHANE B | | | | | | | | 75 | 75 | 75 | 75 |
| | POLYCARBONATE DIOL-DERIVED POLYURETHANE C | | | | | | | 75 | | | | |
| | POLYCARBONATE DIOL-DERIVED POLYURETHANE D | | 75 | | | | | | | | | |
| | POLYCARBONATE DIOL-DERIVED POLYURETHANE E | | | 75 | | | | | | | | |

TABLE 3-continued

| | | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 | COMPARATIVE EXAMPLE 8 | COMPARATIVE EXAMPLE 9 | COMPARATIVE EXAMPLE 10 | COMPARATIVE EXAMPLE 11 |
|---|---|---|---|---|---|---|---|---|---|---|---|---|
| | DIOL-DERIVED POLYURETHANE F POLYCARBONATE | | | | | | | | | | | |
| | DIOL-DERIVED POLYURETHANE G POLYCARBONATE | | | | | | | | | | | |
| | DIOL-DERIVED POLYURETHANE H POLYCARBONATE | | | 75 | | | | | | | | |
| | DIOL-DERIVED POLYURETHANE I POLYESTER-BASED | | | | | 75 | | | | | | |
| | POLYURETHANE J ACRYL NITRILE BUTADIENE RUBBER K | | | | | | | 75 | | | | |
| EVALUATION | PEEL STRENGTH | Excellent | Poor | Poor | Excellent | Excellent | Excellent | Poor | Excellent | Poor | Good | Poor |
| | ELECTRICAL INSULATION RELIABILITY (BHAST) | Excellent | Good | Poor | Excellent | Good | Poor | Excellent | Good | Excellent | Good | Excellent |
| | WIRING EMBEDABILITY | Poor | Excellent | Good | Poor | Poor | Good | Excellent | Poor | Excellent | Poor | Excellent |

(*)The mass of the curing agent was adusted in such a manner that the equivalent amount of the curing agent to one equivalent epoxy group was 0.45 eq.

As shown in Table 2, the thermosetting resin compositions of Examples 1-12 had excellent processability (wiring embedability) by quick pressing and excellent electrical insulation reliability in BHAST. In the evaluation of solder heat resistance, Examples 1 to 12 had excellent solder heat resistance, with no swelling or peeling observed even after contact with a solder bath at 260° C. for 60 seconds or more. All of Examples had a UL94 standard V-0 grade, which is the flame retardance evaluation required for sheet-type electronic materials.

For the evaluation of soldering heat resistance, a sample for measurement (layered plate) prepared by <Peeling Strength (Peel Strength)> (1) Sample Preparation Procedure was floated in a solder bath in such a manner that the copper foil surface of the layered plate was in contact with the solder bath set at 260° C. The state was maintained for 60 seconds or more, and the presence or absence of swelling and peeling was visually confirmed.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2020-124865, filed on Jul. 22, 2020, the entire disclosure of which is incorporated by reference herein.

The invention claimed is:

1. A thermosetting resin composition, comprising:
   a solid epoxy resin that is solid at 25° C.;
   a non-solid epoxy resin that is non-solid at 25° C.;
   particulate rubber dispersed in the non-solid epoxy resin;
   a curing agent;
   an inorganic filler; and
   polycarbonate diol-derived polyurethane,
   wherein
   when a total part by mass of the solid epoxy resin and the non-solid epoxy resin is 100 parts by mass, a content of the solid epoxy resin that is solid at 25° C. is from 60 to 85 parts by mass,
   when a total part by mass of the solid epoxy resin and the non-solid epoxy resin is 100 parts by mass, a content of the non-solid epoxy resin that is non-solid at 25° C. is from 15 to 40 parts by mass,
   when a total part by mass of the solid epoxy resin and the non-solid epoxy resin is 100 parts by mass, a content of the particulate rubber is from 3 to 15 parts by mass,
   an equivalent amount of a curing agent to one equivalent amount of an epoxy group of the solid epoxy resin and the non-solid epoxy resin is from 0.3 to 0.8 equivalents,
   when a total part by mass of the solid epoxy resin and the non-solid epoxy resin is 100 parts by mass, a content of the inorganic filler is from 60 to 150 parts by mass,
   when a total part by mass of the solid epoxy resin and the non-solid epoxy resin is 100 parts by mass, a content of the polycarbonate diol-derived polyurethane is from 50 to 100 parts by mass,
   a NCO/OH ratio of the polycarbonate diol-derived polyurethane at a time of synthesis is from 0.85 to 0.99;
   an acid value of the polycarbonate diol-derived polyurethane is from 10 to 30 mgKOH/g, and
   a weight average molecular weight of the polycarbonate diol-derived polyurethane is from 15,000 to 50,000.

2. The thermosetting resin composition according to claim 1, wherein the particulate rubber comprises core-shell polymer particles.

3. The thermosetting resin composition according to claim 1, wherein when a total part by mass of the solid epoxy resin and the non-solid epoxy resin is 100 parts by mass, parts by mass of the particulate rubber and the non-solid epoxy resin are from 15 to 40 parts by mass.

4. The thermosetting resin composition according to claim 1, wherein when a total part by mass of the solid epoxy resin and the non-solid epoxy resin is 100 parts by mass, parts by mass of the polycarbonate diol-derived polyurethane are from 60 to 90 parts by mass.

5. The thermosetting resin composition according to claim 1, wherein when a total part by mass of the solid epoxy resin and the non-solid epoxy resin is 100 parts by mass, parts by mass of the inorganic filler are from 60 to 120 parts by mass.

6. A coverlay film, comprising:
a base material; and
an adhesive layer that is layered on one side of the base material,
wherein an adhesive material of the adhesive layer comprises the thermosetting resin composition according to claim 1.

7. An adhesive sheet, comprising:
the thermosetting resin composition according to claim 1.

8. A flexible printed wiring board, comprising:
a substrate on which wiring is formed; and
a coverlay film comprising a base material and an adhesive layer that is layered on one side of the base material, wherein the coverlay film is provided in such a manner that the adhesive layer contacts the surface of the substrate on which the wiring is formed, wherein the coverlay film is the coverlay film according to claim 6.

* * * * *